US012649970B2

(12) United States Patent
Bamford et al.

(10) Patent No.: US 12,649,970 B2
(45) Date of Patent: Jun. 9, 2026

(54) VAPOR DELIVERY DEVICE

(71) Applicant: LAM RESEARCH CORPORATION, Fremont, CA (US)

(72) Inventors: Thadeous Bamford, Portland, OR (US); Jorge Reyes, Tigard, OR (US); Emile Draper, Molalla, OR (US)

(73) Assignee: Lam Research Corporation, Fremont, CA (US)

( * ) Notice: Subject to any disclaimer, the term of this patent is extended or adjusted under 35 U.S.C. 154(b) by 499 days.

(21) Appl. No.: 18/030,308

(22) PCT Filed: Oct. 5, 2021

(86) PCT No.: PCT/US2021/053611
§ 371 (c)(1),
(2) Date: Apr. 5, 2023

(87) PCT Pub. No.: WO2022/076444
PCT Pub. Date: Apr. 14, 2022

(65) Prior Publication Data
US 2023/0374657 A1     Nov. 23, 2023

Related U.S. Application Data

(60) Provisional application No. 63/090,138, filed on Oct. 9, 2020.

(51) Int. Cl.
*C23C 16/448*     (2006.01)
*C23C 16/455*     (2006.01)
(Continued)

(52) U.S. Cl.
CPC .... *C23C 16/4481* (2013.01); *C23C 16/45525* (2013.01); *C23C 16/505* (2013.01);
(Continued)

(58) Field of Classification Search
None
See application file for complete search history.

(56) References Cited

U.S. PATENT DOCUMENTS 6,007,330 A  *  12/1999  Gauthier ................. C23C 16/52
                                                              427/248.1
9,334,566 B2     5/2016  Chandrasekharan et al.
(Continued)

FOREIGN PATENT DOCUMENTS

CN          101511460 A      8/2009
JP          2008004837 A     1/2008
KR      1020150060566 A      6/2015

OTHER PUBLICATIONS

International Search Report and Written Opinion of the ISA issued in PCT/US2021/053611, mailed Jan. 20, 2022; ISA/KR.
(Continued)

*Primary Examiner* — Jason Berman

(57) ABSTRACT

An evaporator assembly for a processing chamber in a substrate processing system comprises a canister configured to store and heat precursor liquid and an evaporator valve block mounted the canister. The evaporator valve block comprises a body, a plurality of valves mounted on the body, a carrier gas inlet in fluid communication with the canister, a precursor liquid inlet in fluid communication with the canister, a vapor port in fluid communication with the canister, and a vapor outlet in fluid communication with the processing chamber. Each of the plurality of valves is in fluid communication with respective flow paths contained within the evaporator valve block.

20 Claims, 4 Drawing Sheets

(51) Int. Cl.
C23C 16/505 (2006.01)
H01J 37/32 (2006.01)
(52) U.S. Cl.
CPC .. H01J 37/32449 (2013.01); H01J 37/32458
(2013.01); H01J 2237/3321 (2013.01)

(56) References Cited

U.S. PATENT DOCUMENTS

| | | | | |
|---|---|---|---|---|
| 2007/0194470 | A1* | 8/2007 | Dedontney | B01F 25/105 |
| | | | | 261/76 |
| 2007/0235085 | A1* | 10/2007 | Nakashima | C23C 16/4408 |
| | | | | 137/240 |
| 2008/0085226 | A1 | 4/2008 | Fondurulia et al. | |
| 2008/0099933 | A1 | 5/2008 | Choi et al. | |
| 2014/0041590 | A1* | 2/2014 | Jang | C23C 16/4481 |
| | | | | 118/726 |
| 2020/0071820 | A1 | 3/2020 | Herle et al. | |

OTHER PUBLICATIONS

Office Action received for related KP App. No. 10-2023-7015582 dated Apr. 20, 2026.

* cited by examiner

VAPOR DELIVERY DEVICE

CROSS-REFERENCE TO RELATED APPLICATIONS

This application is a U.S. National Phase Application under 35 U.S.C. 371 of International Application No. PCT/US2021/053611, filed on Oct. 5, 2021, which claims the benefit of U.S. Provisional Application No. 63/090,138, filed on Oct. 9, 2020. The entire disclosures of the applications referenced above are incorporated herein by reference.

FIELD

The present disclosure relates to gas delivery systems for substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems for performing deposition and/or etching typically include a processing chamber with a pedestal. A substrate such as a semiconductor wafer may be arranged on the pedestal during processing. A process gas mixture including one or more precursors may be introduced into the processing chamber to deposit film on the substrate or to etch the substrate. In some substrate processing systems, radio frequency (RF) plasma can be struck in the processing chamber and/or an RF bias on the pedestal may be used to activate chemical reactions.

Various gas flow paths in the gas delivery system are used to deliver process gases, carrier gases, oxidizing gases, precursor gases and/or purge gases to the processing chamber. The gas flow paths are defined by via tubing, valves, manifolds and gas flow channels in a valve inlet block.

SUMMARY

An evaporator assembly for a processing chamber in a substrate processing system comprises a canister configured to store and heat precursor liquid and an evaporator valve block mounted the canister. The evaporator valve block comprises a body, a plurality of valves mounted on the body, a carrier gas inlet in fluid communication with the canister, a precursor liquid inlet in fluid communication with the canister, a vapor port in fluid communication with the canister, and a vapor outlet in fluid communication with the processing chamber. Each of the plurality of valves is in fluid communication with respective flow paths contained within the evaporator valve block.

In other features, the plurality of valves includes a first valve, a second valve, a third valve, a fourth valve, and a fifth valve. The first valve, the second valve, the third valve, and the fourth valve extend outward horizontally from a first side of the evaporator valve block. The first valve, the second valve, the third valve, and the fourth valve are arranged are arranged side-by-side on the first side of the evaporator block in a direction parallel to a longitudinal axis of the evaporator valve block. Longitudinal axes of the first valve, the second valve, the third valve, and the fourth valve are perpendicular to the longitudinal axis of the evaporator valve block.

In other features, the fifth valve extends upward from the evaporator valve block. A longitudinal axis of the fifth valve is perpendicular to a longitudinal axis of the evaporator valve block. The first valve is in fluid communication with a bulk supply valve block configured to selectively supply the precursor liquid to the canister. The second valve is in fluid communication with a carrier gas source, the third valve, and the fourth valve. The third valve is in fluid communication with the carrier gas inlet. The carrier gas inlet is offset from the third valve in a lateral direction. The fourth valve is in fluid communication with the fifth valve.

In other features, the fifth valve is in fluid communication with the vapor port and the vapor outlet. The first valve is in fluid communication with a bulk supply valve block configured to selectively supply the precursor liquid to the canister. The second valve is adjacent to the first valve and is in fluid communication with a carrier gas source, the third valve, and the fourth valve. The third valve is adjacent to the second valve and is in fluid communication with the carrier gas inlet. The fourth valve is adjacent to the third valve and is in fluid communication with the fifth valve. The fifth valve is arranged above the fourth valve and is in fluid communication with the vapor port and the vapor outlet.

In other features, the carrier gas inlet and the vapor port are located on opposite sides of the evaporator valve block. The evaporator assembly further comprises an inlet tube extending downward from the precursor liquid inlet into the canister. An upper end of the inlet tube includes an opening in a sidewall of the inlet tube that provides fluid communication between an interior of the inlet tube and the canister through the sidewall. The evaporator assembly further comprises a level sensor extending downward from the carrier gas inlet. The carrier gas inlet is aligned with the level sensor such that carrier gas flowing through the carrier gas inlet flows through a channel within the level sensor and into the canister. The evaporator valve block is mounted on a lid of the canister.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

A gas delivery system includes an arrangement of tubing, valves, manifolds, and gas flow channels to supply gas mixtures to respective processing chambers or stations in a substrate processing system (e.g., a substrate processing system configured to perform deposition processes including, but not limited to, chemical vapor deposition (CVD), plasma enhanced CVD (PECVD), and thermal atomic layer deposition (ALD)). The gas delivery system may be further configured to supply vapor (e.g., water vapor) to the processing chambers.

In some examples, the gas delivery system includes a vaporizer and a liquid flow controller arranged to flow and vaporize ultrapure water (UPW) or another precursor. Vaporizers may have a high response time (e.g., between 0.5 and 5.0 seconds to ramp up to full output). However, some processes (e.g., ALD processes) perform dosing steps of less than 0.5 seconds (e.g., less than 0.25 seconds). In other examples, ampoules are used to heat water or another precursor to form vapor within a canister and a carrier gas is flowed to entrain the vapor. Ampoules may have a lower response time relative to vaporizers. However, ampoules are expensive and have additional design difficulties (e.g., requiring additional components such as heaters, multiple sensors, and other electronics) relative to vaporizers.

Gas delivery systems and methods according to the present disclosure implement an integrated evaporator assembly configured to generate and supply vapor (e.g., water vapor) to a processing chamber. The evaporator assembly includes a heated canister (e.g., an electro-polished, stainless steel canister) that stores a vapor precursor (e.g., UPW) under vacuum. An integrated evaporator valve block is mounted on the canister (e.g., mounted on or integrated with a lid of the canister). The evaporator valve block includes a plurality of valves configured to provide respective functions. For example, the evaporator valve block includes five valves configured to respectively fill the canister with UPW, flow an inert carrier gas into the canister via a gas inlet, release vapor from the canister to a vapor outlet, purge liquid (e.g., the UPW) from a fill line and into the canister, and bypass carrier gas from the gas inlet to the vapor outlet.

The evaporator assembly reduces system complexity and cost. For example, integrating the valves within a single valve block simplifies heating, access, and maintenance of the valves. Heating uniformity is increased and cold sports are eliminated, reducing particle formation and accumulation within various valve inlets and outlets. For example, the valve block may be enclosed in a jacket or wrap heater and may include one or more insertion heaters.

Figure 1:
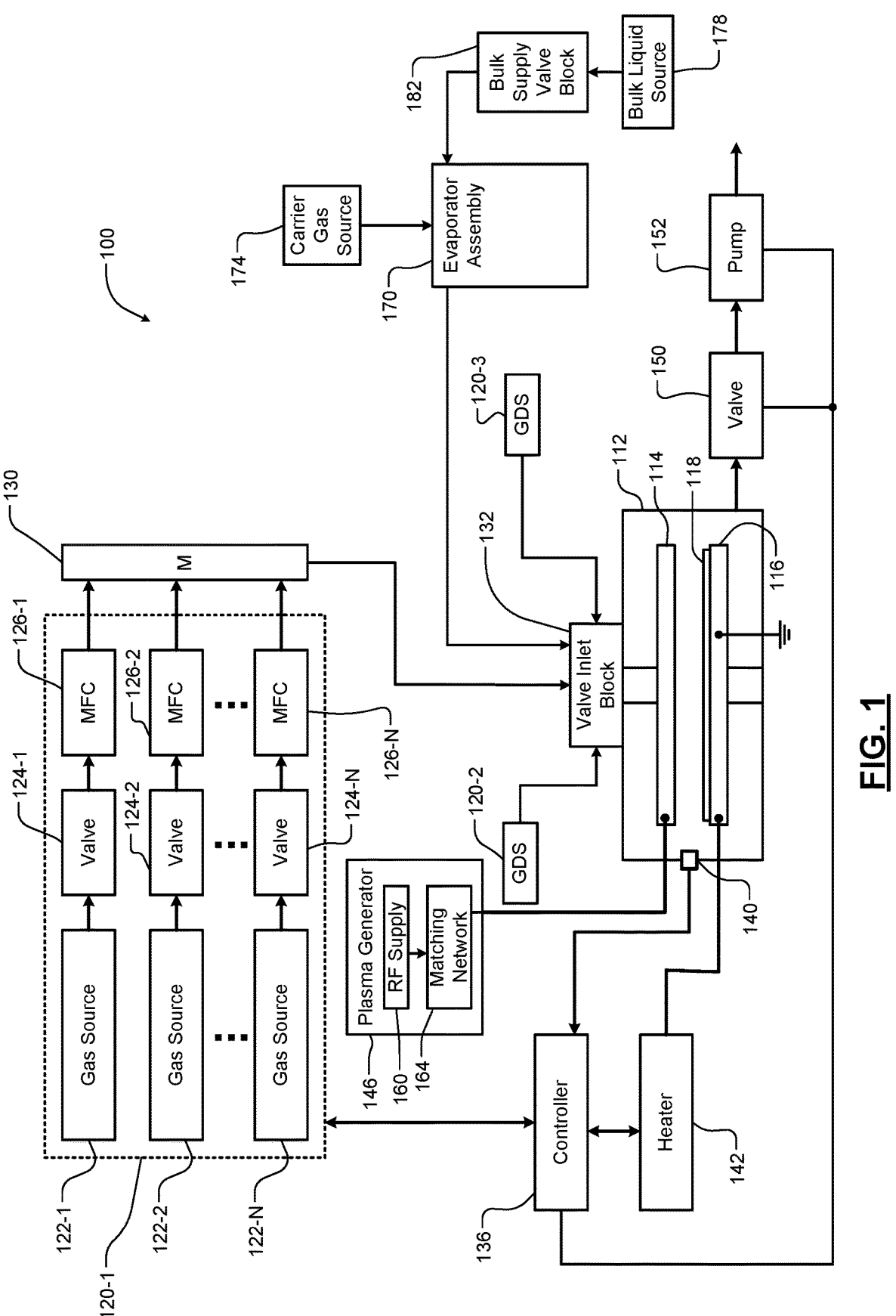
FIG. 1 is a functional block diagram of an example of a substrate processing system according to the present disclosure.

Referring now to FIG. 1, an example substrate processing system 100 includes a processing chamber 112 with a reaction volume. In some examples, the substrate processing system 100 is configured to perform a plasma-enhanced chemical vapor deposition (CVD) or plasma enhanced atomic layer deposition (ALD) process. Process gas mixtures may be supplied to the processing chamber 112 using a gas distribution device 114 such as a showerhead. In some examples, the showerhead is a chandelier-type showerhead. A substrate 118 such as a semiconductor wafer may be arranged on a substrate support 116 during processing. The substrate support 116 may include a pedestal, an electrostatic chuck, a mechanical chuck or other type of substrate support.

One or more gas delivery systems (GDS) 120-1, 120-2, and 120-3 may each include one or more gas sources 122-2, 122-2, . . . , and 122-N (collectively gas sources 122), where N is an integer greater than one. Valves 124-1, 124-2, . . . , and 124-N (collectively valves 124), mass flow controllers 126-1, 126-2, . . . , and 126-N (collectively mass flow controllers 126), or other flow control devices may be used to supply one or more gases to a manifold 130, which supplies a gas mixture through a valve inlet block 132 to the processing chamber 112. The valve inlet block 132 includes a plurality of valves and defines respective flow paths for gas mixtures supplied to the processing chamber 112. The valve inlet block 132 may include one or more divert paths for selectively diverting gas to vacuum or exhaust. One or more additional gas delivery systems may be provided to supply gases or gas mixtures in other locations.

A controller 136 may be used to monitor process parameters such as temperature, pressure, etc. (using one or more sensors 140) and to control process timing. The controller 136 may be used to control process devices such as gas delivery systems 120-1, 120-2 and 120-3, a substrate support heater 142, and/or an RF plasma generator 146. The controller 136 may also be used to evacuate the processing chamber 112 using a valve 150 and pump 152.

The RF plasma generator 146 generates the RF plasma in the processing chamber. The RF plasma generator 146 may be an inductive or capacitive-type RF plasma generator. In some examples, the RF plasma generator 146 may include an RF supply 160 and a matching and distribution network 162. While the RF plasma generator 146 is shown connected to the gas distribution device 114 and the substrate support is grounded or floating, the RF plasma generator 146 can be connected to the substrate support 116 and the gas distribution device 114 can be grounded or floating.

An evaporator assembly 170 according to the present disclosure is configured to supply vaporized precursor (e.g., water vapor) to the valve inlet block 132. A carrier gas is supplied to the evaporator (e.g., to a canister via an evaporator valve block, not shown in FIG. 1) 170 from a carrier gas source 174. Liquid (e.g., UPW) is supplied to the evaporator assembly 170 from a bulk liquid source 178 via a bulk supply valve block 182.

Figure 2A:
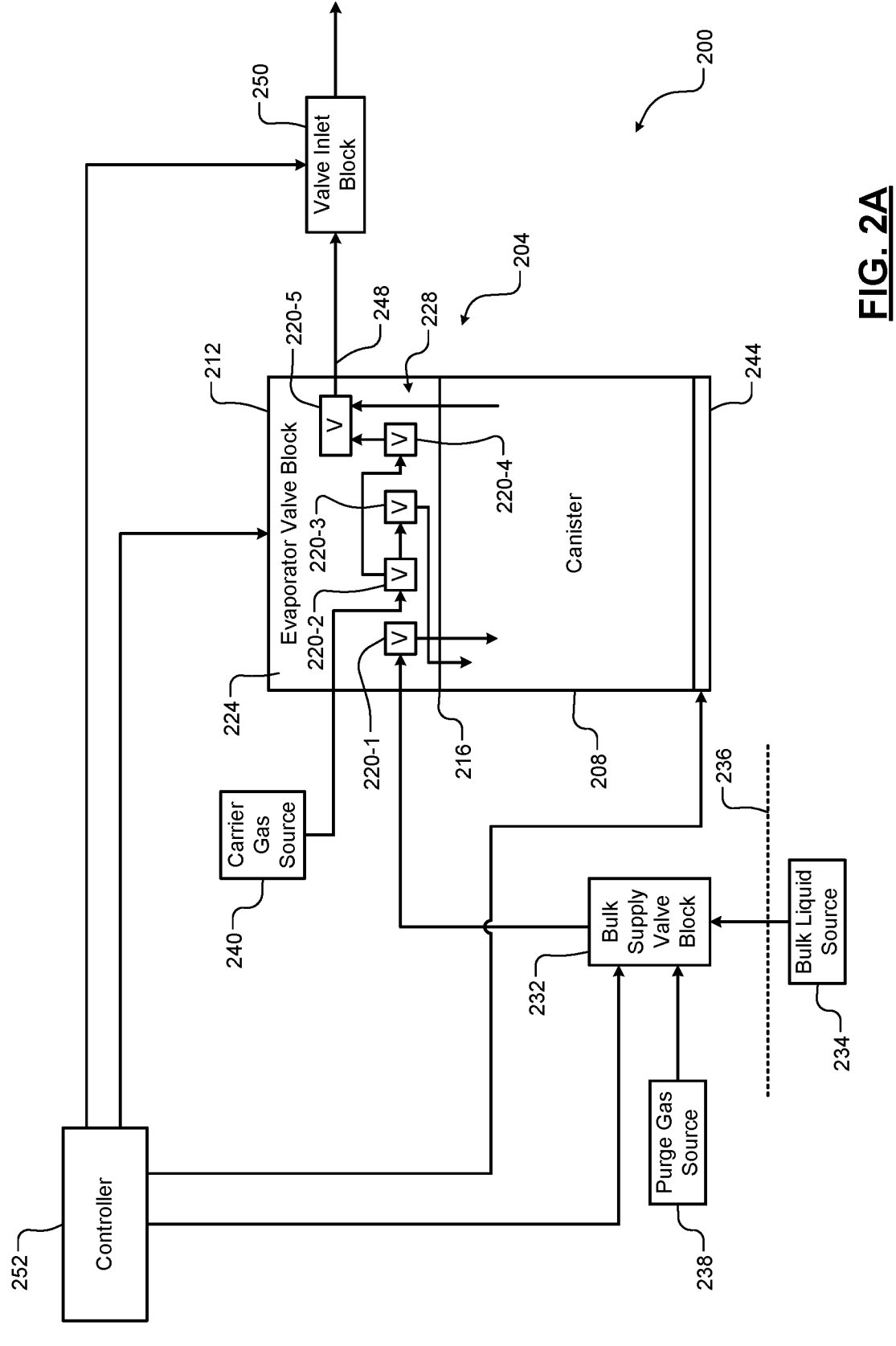
FIG. 2A is a functional block diagram of a vapor supply system including an example evaporator assembly according to the present disclosure.
Figure 2C:
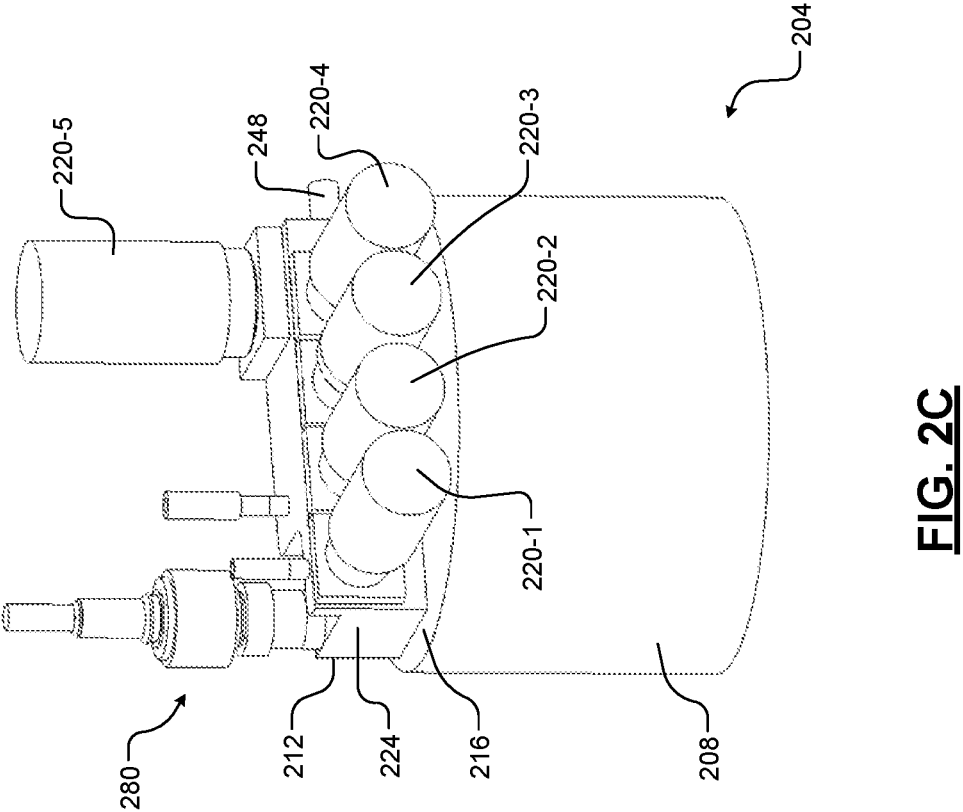
FIG. 2C is an isometric view of an example evaporator assembly according to the present disclosure.
Figure 2B:
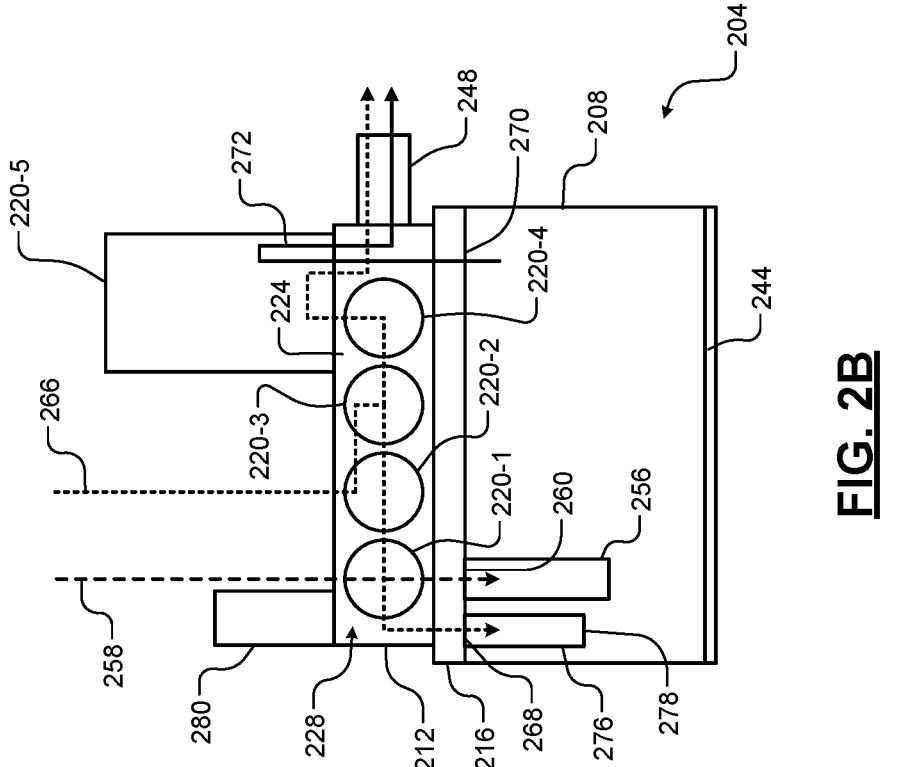
FIG. 2B is an example evaporator assembly according to the present disclosure.

A vapor supply system 200 including an example evaporator assembly 204 according to the present disclosure is described in more detail in FIGS. 2A, 2B, and 2C. The evaporator assembly 204 includes a canister 208 and an evaporator valve block 212 mounted on the canister 208. For example, the evaporator valve block 212 is mounted on or integrated with a lid 216 of the canister 208. The evaporator valve block 212 includes a plurality of valves (e.g., valves 220-1, 220-2, 220-3, 220-4, and 220-5, referred to collectively as valves 220) mounted on a same housing or body 224 of the evaporator valve block 212. Flow paths to and/or from the valves 220 are enclosed within an interior 228 of the body 224.

For example, the valve 220-1 is in fluid communication with a bulk supply valve block 232 configured to selectively supply liquid (e.g., a liquid precursor, such as UPW) from a facility bulk liquid source 234. For example, the bulk liquid source 234 is located external to the substrate processing system (e.g., beneath a floor 236 of a facility). The bulk supply valve block 232 may also selectively supply a purge gas (e.g., nitrogen (N₂) to the valve 220-1 from a purge gas source 238. The valve 220-1 supplies the liquid to the canister 208 through the evaporator valve block 212. Respective valves (not shown) corresponding to the bulk liquid source 234 and the purge gas source 238 are contained within the same bulk supply valve block 232. For example only, a valve in fluid communication with the purge gas source 238 is located in a flow path upstream of (i.e., closer to the valve 220-1) a valve in fluid communication with the bulk liquid source 234.

The valve 220-2 is in fluid communication with a carrier gas (e.g., N₂) source 240. The valve 220-2 selectively flows the carrier gas to the valves 220-3 and 220-4. The valve 220-3 selectively supplies the carrier gas to the canister 208 to entrain vapor (e.g., vaporized precursor liquid) that is formed when the canister 208 is heated (e.g., using heater 244). The valve 220-4 selectively supplies the carrier gas to the valve 220-5 to purge flow paths within the evaporator valve block 212. The heater 244 may correspond to one or more separately or collectively controlled resistive heaters, a jacket or wrap heater (e.g., a heater film or layer surrounding the canister 208), etc. In some examples, the heater 244 may include one or more flanged insertion heaters extending through the bottom and/or sidewalls of the canister 208 to directly heat the liquid.

The valve 220-5 is in fluid communication with the canister 208 and a vapor outlet 248. As shown, the valve 220-5 is arranged on a top side of the evaporator valve block 212 above the valve 220-4. The valve 220-5 selectively supplies vapor (i.e., a carrier gas and vapor mixture) from the canister 208, through the vapor outlet 248, to a valve inlet block 250 (e.g., corresponding to the valve inlet block 132 of FIG. 1). For example, to supply vapor, the heater 244 is controlled (e.g., in response to signals from controller 252) to heat the liquid precursor inside the canister 208 to form the vapor. The valves 220 are selectively controlled (e.g., using the controller 252) to flow the carrier gas into the canister 208 to entrain the vapor and flow the vapor out of the vapor outlet 248.

Figure 2D:
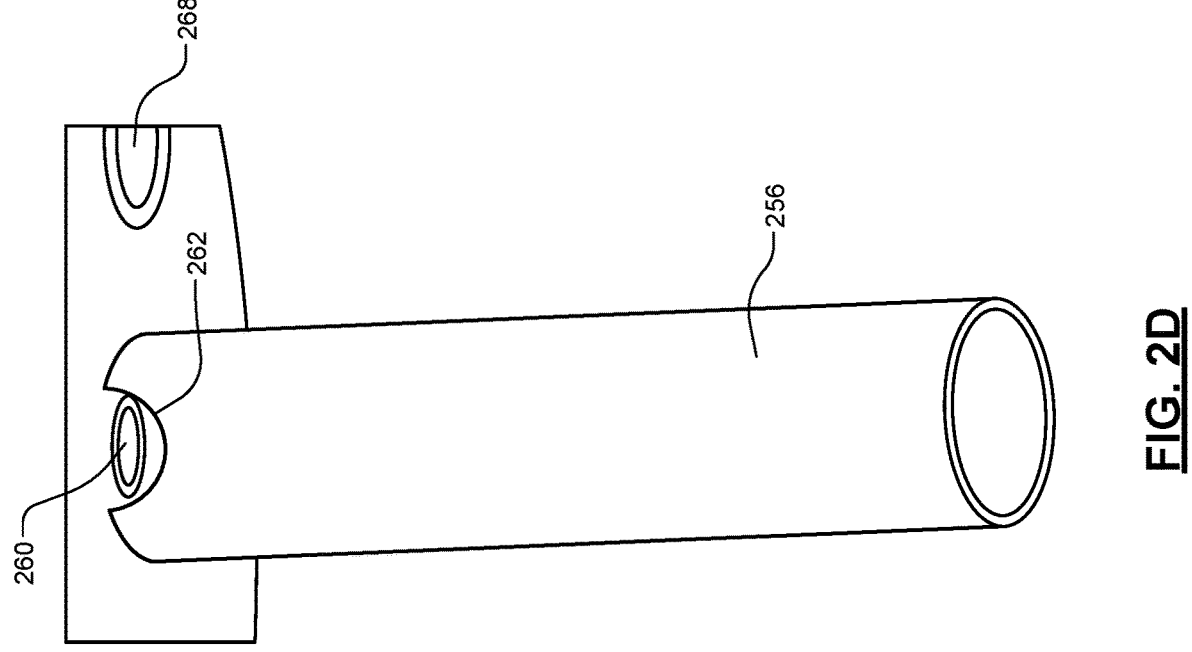
FIG. 2D is an inlet tube of an evaporator assembly according to the present disclosure.

FIGS. 2B, 2C, and 2D show the example evaporator assembly 204 in more detail. FIG. 2B is a front view of the evaporator assembly 204 and FIG. 2C is an isometric view of the evaporator assembly 204. A flow path of the liquid precursor through the valve 220-1 and an inlet tube 256 (shown in more detail in FIG. 2D) into the canister 208 is shown at 258. The inlet tube 256 surrounds a liquid precursor inlet 260 and extends downward into the canister 208. For example, a pressure differential between the bulk liquid source 234 and the canister 208 (which may be maintained at a vacuum pressure) causes rapid expansion and splashing of the liquid during filling. The inlet tube 256 surrounding the liquid precursor inlet 260 contains splashing during filling of the canister 208.

An upper end of the inlet tube 256 may include an opening, notch, or baffle 262 in a sidewall of the inlet tube 256. The opening 262 provides fluid communication between an interior of the upper end of the inlet tube 256 and the canister 208. Accordingly, purge gas supplied to purge the flow paths within the evaporator valve block 212 (e.g., from the purge gas source 238) flows through the valve 220-1 and liquid precursor inlet 260 and out of the opening 262 instead of flowing downward into the inlet tube 256. In this manner, bubbling inside the liquid inside the canister 208 is avoided.

A flow path of the carrier gas through the valves 220-2, 220-3, 220-4, and 220-5 is shown at 266. When the valves 220-2 and 220-3 are open, the carrier gas flows from the carrier gas (e.g., N$_2$) source 240 through the valves 220-2 and 220-3 into the canister 208 through a carrier gas inlet 268 to entrain vapor. The carrier gas and vapor mixture flows out of the canister 208 through a vapor port 270 and the valve 220-5 (when open) and out of the vapor outlet 248. The flow path of the vapor is shown at 272.

The carrier gas inlet 268 and the vapor port 270 are on opposite sides of the evaporator valve block 212 (and the lid 216). For example, the carrier gas inlet 268 is located on a leftmost (or rightmost) end of the evaporator valve block 212 while the vapor port 270 is located on a rightmost (or leftmost) end of the evaporator valve block 212. In this manner, during supply of the vapor through the vapor port 270 (which coincides with supply of the carrier gas into the canister 208 via the carrier gas inlet 268), the flow of the carrier gas is spaced apart from the vapor port 270 to avoid blowing the vapor away from the vapor port 270. As shown, the carrier gas flows into the canister 208 in a location that is laterally offset from a location of the valve 220-3.

In some examples (as shown), the carrier gas inlet 268 also functions as a level sensor port. For example, a level sensor 276 extends downward from the carrier gas inlet 268 into the canister 208. A channel 278 through the level sensor 276 is aligned with (e.g., is coaxial or concentric with) the carrier gas inlet 268. The level sensor 276 may be a multi-position (e.g., four position) discrete level sensor. The level sensor 276 provides a signal to the controller 252 (e.g., via connector and wiring 280) indicative of the level of the liquid inside the canister 208. The controller 252 selectively controls the valves 220 to fill the canister 208 with the precursor liquid based on the level of the liquid indicated by the level sensor 276.

As shown in FIG. 2C, each of the valves 220 is mounted on the evaporator valve block 212 and corresponding flow paths (and associated tubing, weldments, etc.) are enclosed within the evaporator valve block 212. Accordingly, heating of the evaporator valve block 212 is simplified and heating non-uniformities are reduced. For example, cold spots within the evaporator valve block 212 are reduced. In one example, a heater jacket or wrap (e.g., a film) is bonded to an outer surface of the evaporator valve block 212. For example, the heater jacket is a sheet or mat comprising heater wiring (e.g., a wiring mesh) that is bonded to the outer surface of the evaporator valve block 212.

As shown, four of the valves (220-1, 220-2, 220-3, and 220-4) are arranged on a first (e.g., front) side of the evaporator valve block 212. For example, the valves 220-1, 220-2, 220-3, and 220-4 extend outward horizontally from the front side of the evaporator valve block such that longitudinal axes of the valves 220-1, 220-2, 220-3, and 220-4 are perpendicular to a longitudinal (e.g., vertical, as shown) axis of the evaporator valve block 212 in a first direction. The valves 220-1, 220-2, 220-3, and 220-4 are arranged side-by-side on the front side of the evaporator block 212 in a direction parallel to the longitudinal axis of the evaporator valve block 212. Conversely, the valve 220-5 extends upward (outward vertically) from a second (e.g., top) side of the evaporator valve block 212 such that a longitudinal axis of the valve 220-5 is perpendicular to the longitudinal axis of the evaporator valve block 212 and a flow direction of vapor out of the vapor outlet 248 in a second direction.

Further, the body 224 of the evaporator valve block 212 is contained within a footprint defined by an outer perimeter of the canister 208 and the lid 216. The longitudinal axis of the evaporator valve block 212 is perpendicular to a vertical axis of the canister 208. For example, the evaporator valve block 212 extends horizontally across the lid 216 of the canister 208.

In other examples, the valves 220 may be arranged in a different sequence than shown, and/or one or more of the valves 220 may have a different orientation or location on the evaporator valve block 212. For example, one or more of the valves 220 may be arranged on the front side of the evaporator valve block 212 (as shown) while one or more of the valves 220 are arranged on a different side of the evaporator block 212 (e.g., on the top side, a back side, etc.).

Although described as being mounted on the lid 216 of the canister 208, in other examples the evaporator valve block 212 may be mounted on other locations of the canister 208 (e.g., on sidewalls of the canister 208). Further, although shown in an upright orientation, in other examples the canister 208 may have other orientations (e.g., an orientation where the longitudinal axis of the canister 208 is horizontal instead of vertical). The canister 208 may be taller or shorter than shown. As shown, a height of the canister 208 is less than a diameter of the canister 208 to maximize a surface area of the stored liquid. The canister 208 may have a different shape (e.g., rectangular instead of cylindrical).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. An evaporator assembly for a processing chamber in a substrate processing system, the evaporator assembly comprising:
   a canister configured to store and heat precursor liquid; and
   an evaporator valve block mounted the canister, wherein the evaporator valve block includes
   a body,
   a plurality of valves mounted on the body,
   a carrier gas inlet in fluid communication with the canister,
   a precursor liquid inlet in fluid communication with the canister,
   a vapor port in fluid communication with the canister, and
   a vapor outlet in fluid communication with the processing chamber,
   wherein each of the plurality of valves is in fluid communication with respective flow paths contained within the evaporator valve block, and
   wherein each of the carrier gas inlet, the precursor liquid inlet and the vapor port define separate openings in the canister.

2. The evaporator assembly of claim 1, wherein the plurality of valves includes a first valve, a second valve, a third valve, a fourth valve, and a fifth valve.

3. The evaporator assembly of claim 2, wherein the first valve, the second valve, the third valve, and the fourth valve extend outward horizontally from a first side of the evaporator valve block.

4. The evaporator assembly of claim 3, wherein the first valve, the second valve, the third valve, and the fourth valve are arranged are arranged side-by-side on the first side of the evaporator valve block in a direction parallel to a longitudinal axis of the evaporator valve block.

5. The evaporator assembly of claim 4, wherein longitudinal axes of the first valve, the second valve, the third valve, and the fourth valve are perpendicular to the longitudinal axis of the evaporator valve block.

6. The evaporator assembly of claim 2, wherein the fifth valve extends upward from the evaporator valve block.

7. The evaporator assembly of claim 6, wherein a longitudinal axis of the fifth valve is perpendicular to a longitudinal axis of the evaporator valve block.

8. The evaporator assembly of claim 2, wherein the first valve is in fluid communication with a bulk supply valve block configured to selectively supply the precursor liquid to the canister.

9. The evaporator assembly of claim 2, wherein the second valve is in fluid communication with a carrier gas source, the third valve, and the fourth valve.

10. The evaporator assembly of claim 9, wherein the third valve is in fluid communication with the carrier gas inlet.

11. The evaporator assembly of claim 10, wherein the carrier gas inlet is offset from the third valve in a lateral direction.

12. The evaporator assembly of claim 9, wherein the fourth valve is in fluid communication with the fifth valve.

13. The evaporator assembly of claim 2, wherein the fifth valve is in fluid communication with the vapor port and the vapor outlet.

14. The evaporator assembly of claim 2, wherein:
   the first valve is in fluid communication with a bulk supply valve block configured to selectively supply the precursor liquid to the canister;
   the second valve is adjacent to the first valve and is in fluid communication with a carrier gas source, the third valve, and the fourth valve;
   the third valve is adjacent to the second valve and is in fluid communication with the carrier gas inlet;
   the fourth valve is adjacent to the third valve and is in fluid communication with the fifth valve; and
   the fifth valve is arranged above the fourth valve and is in fluid communication with the vapor port and the vapor outlet.

15. An evaporator assembly for a processing chamber in a substrate processing system, the evaporator assembly comprising:
   a canister configured to store and heat precursor liquid; and
   an evaporator valve block mounted the canister, wherein the evaporator valve block includes
   a body,
   a plurality of valves mounted on the body,
   a carrier gas inlet in fluid communication with the canister,
   a precursor liquid inlet in fluid communication with the canister,
   a vapor port in fluid communication with the canister, and
   a vapor outlet in fluid communication with the processing chamber,
   wherein each of the plurality of valves is in fluid communication with respective flow paths contained within the evaporator valve block, and
   wherein the carrier gas inlet and the vapor port are located on opposite sides of the evaporator valve block.

16. An evaporator assembly for a processing chamber in a substrate processing system, the evaporator assembly comprising:
   a canister configured to store and heat precursor liquid;
   an evaporator valve block mounted the canister, wherein the evaporator valve block includes
   a body,
   a plurality of valves mounted on the body,
   a carrier gas inlet in fluid communication with the canister,
   a precursor liquid inlet in fluid communication with the canister,
   a vapor port in fluid communication with the canister, and
   a vapor outlet in fluid communication with the processing chamber; and
   an inlet tube extending downward from the precursor liquid inlet into the canister,
   wherein each of the plurality of valves is in fluid communication with respective flow paths contained within the evaporator valve block.

17. The evaporator assembly of claim 16, wherein an upper end of the inlet tube includes an opening in a sidewall of the inlet tube that provides fluid communication between an interior of the inlet tube and the canister through the sidewall.

18. The evaporator assembly of claim 1, further comprising a level sensor extending downward from the carrier gas inlet.

19. The evaporator assembly of claim 18, therein the carrier gas inlet is aligned with the level sensor such that carrier gas flowing through the carrier gas inlet flows through a channel within the level sensor and into the canister.

20. The evaporator assembly of claim 1, wherein the evaporator valve block is mounted on a lid of the canister.

* * * * *